United States Patent [19]

Seiler

[11] 4,104,546

[45] Aug. 1, 1978

[54] INTEGRATED CIRCUIT FOR USE WITH VARIABLE VOLTAGES

[75] Inventor: Hartmut Seiler, Reutlingen, Germany

[73] Assignee: Robert Bosch GmbH, Stuttgart, Germany

[21] Appl. No.: 769,431

[22] Filed: Feb. 17, 1977

[30] Foreign Application Priority Data

Apr. 6, 1976 [DE] Fed. Rep. of Germany ....... 2614781

[51] Int. Cl.[2] ........................ H03K 5/20; H03K 19/40

[52] U.S. Cl. .................................... 307/362; 307/303; 357/51

[58] Field of Search ............... 307/354, 362, 214, 303; 219/121 L; 357/51

[56] References Cited

U.S. PATENT DOCUMENTS

| 3,761,787 | 9/1973 | Davis et al. | 307/299 B |
|---|---|---|---|
| 3,930,304 | 1/1976 | Keller et al. | 29/574 |

*Primary Examiner*—John Zazworsky
*Attorney, Agent, or Firm*—Flynn & Frishauf

[57] ABSTRACT

To reliably ensure response of integrated circuits having threshold inputs, while rejecting interference and noise pulses, the input stage is formed with a plurality of resistors which can be selectively vaporized or burned off to match the input response of the threshold circuit to any input operating voltage without requiring the use of discrete, replaceable input resistors. Preferably, the input voltages are conducted to voltage dividers which have resistors which can be selectively removed by evaporation or burning off. The circuit can also have inverters bridged by a vaporizable shunt to respond to voltages of selected polarity or provide an output of selected polarity.

9 Claims, 3 Drawing Figures

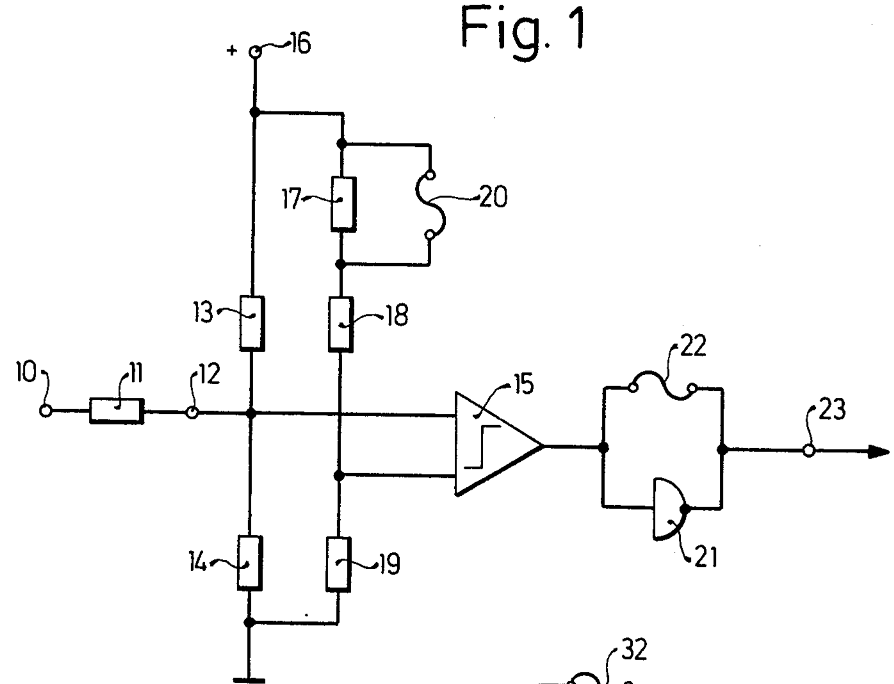
Fig. 1
16
17
20
13
18
22
10
11
12
15
23
21
14
19
32
30
31
Fig. 1a
30'
31'
12
32'
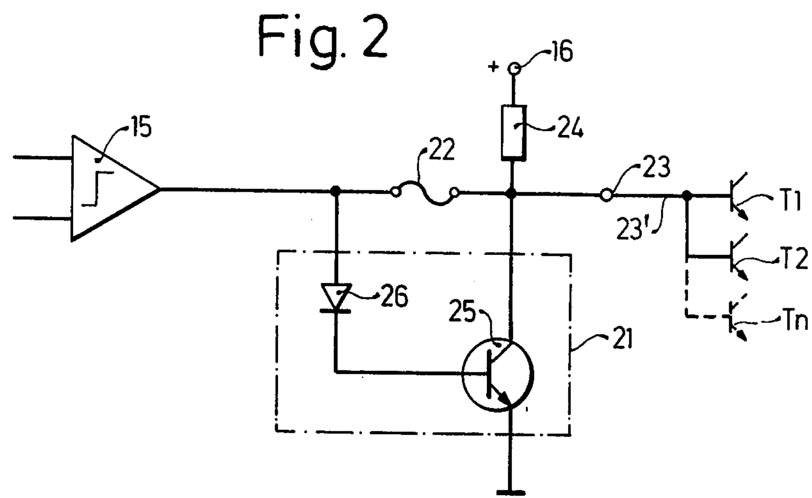
Fig. 2
16
15
22
24
23
T1
23'
T2
26
25
Tn
21

INTEGRATED CIRCUIT FOR USE WITH VARIABLE VOLTAGES

The present invention relates to an integrated circuit having at least one input to which a threshold circuit is connected. The threshold level of the threshold circuit is controllable.

Digital circuits must reliably respond to input voltages at certain voltage levels, that is, the input voltage level should reliably trigger the input circuit to respond to the respective level. It is therefore necessary to eliminate influences of even small noise or other interfering voltages which might lead to undesired, spurious switching responses. It is also necessary that electronic elements in the integrated circuits, and particularly digital gates, have input threshold voltages below which an input signal is not recognized as a desired control signal, that is, which should not trigger a response. The input response level should, however, be arbitrarily adjustable, and the use of the integrated circuit can be substantially expanded if the input level can be set as desired. Thus, the input of the integrated circuit may have a threshold stage associated therewith, the threshold level of which can be set as desired, and as required by the specific application with which integrated circuit is to be used. If the circuit has a plurality of inputs, then the input level of each one of the inputs can be arbitrarily determined as desired.

Electronic circuits which use threshold input stages can readily be matched to respond to specific signals, for example by interchanging resistors in the input stage. This is not possible in integrated circuits, however, since the resistance values in the circuits are fixed. Thus, the threshold level of a threshold input stage of an integrated circuit can no longer be changed after its manufacture. The integrated circuit then will have a certain predetermined input level which will cause, or not cause its response. Matching such a circuit to input voltages of different levels, that is, of higher or lower ones, requires external network components.

It is an object of the present invention to provide an integrated circuit which can be matched to different input voltage levels without use of external components.

SUBJECT MATTER OF THE PRESENT INVENTION

Briefly, the integrated circuit includes an input threshold stage which has input resistors, preferably connected in form of voltage dividers, in which some of the resistors are bridged by shunts which can be vaporized or burned off, so that these resistors can be selectively disabled, or left inserted in the circuit, thereby matching the level or threshold response of the overall circuit to specific input voltages.

Input voltages of reverse polarity can also be accomodated if at least one input is provided which is connected to an inverter stage which, likewise, is shunted or bridged by a path which can be removed after manufacture of the integrated circuit, by vaporization or by burning away. The inverter stage can be connected to the input, as well as to the output of the threshold circuit.

The present invention permits application of voltages of any desired value and polarity to control integrated circuits which can be made in mass production without requiring external matching networks. The vaporizable shunt paths permit matching of a completed integrated circuit element after its manufacture to various desired input voltages. Integrated circuits which generally are widely used, such as timing circuits for example, thus can be universally applied with networks of different operating levels and characteristics.

DRAWINGS: ILLUSTRATING AN EXAMPLE:

FIG. 1 is a schematic circuit diagram of a portion of an integrated circuit illustrating the invention;

FIG. 1*a* is a fragmentary diagram of a modification of the circuit of FIG. 1; and FIG. 2 is a fragmentary diagram of a portion of the circuit of FIG. 1 illustrating another embodiment and specifically the details of an inverter stage.

An input terminal 10 (FIG. 1) is connected over a current limiting resistor 11 to the input terminal 12 of the integrated circuit itself which, already, may be internal of the integrated circuit. The input terminal 12 of the integrated circuit is connected to the tap point of a voltage divider formed of two resistors 13, 14, the tap point being additionally connected to one input of an operational amplifier 15 connected as a threshold circuit. The voltage divider 13, 14 is connected between the positive terminal 16 of a supply source and ground or chassis. The second voltage divider comprising three resistors 17, 18, 19 is connected in parallel to the first voltage divider. The junction between resistors 18, 19 is connected to the second input of the operational amplifier. Resistor 17 is bridged or shunted by a path 20 which can be vaporized or burned away. The output of the threshold circuit 15 is connected to an inverter 21. Inverter 21 is also shunted or bridged by a vaporizable burn-off path 22. The output of the burn-off path 22, in parallel with the inverter 21, is connected to output terminal 23 which, in turn, is further connected to the remaining portions of the integrated circuit, such as logic gates, and the like. The integrated circuit portion beyond terminal 23 may take any desired form. The integrated circuit beyond terminal 23, together with the arrangement from terminals 10 to 23, forms a common integrated structure.

Vaporizing or burning off the paths 20, 22 is known per se. Such vaporizable shunt paths can be burned off by short current pulses if the respective circuit element 17, 21 is intended to become effective. These shunts 20, 22 can be burned off when the integrated circuit has been manufactured. Of course, the voltage divider formed by resistors 17, 18, 19 may have more than three resistors, other resistors can be connected in parallel with the resistors shown, and these other resistors may have additional burn-off paths connected thereto to render them effective or ineffective, respectively.

Operation, with reference to customary digital signal notation: A 0-signal represents a voltage which corresponds approximately to ground voltage; a 1-signal represents a voltage which is clearly positive with respect to the zero voltage and is to be recognized by the circuit connected to terminal 23 for logical signal processing.

Application of any desired voltage to terminal 10, or terminal 12, respectively, will result, as desired, in a 1-signal or a 0-signal at output terminal 23, depending upon whether the shunt path 22 is effective or has been burned off. Removing the path 20 across resistor 17 permits selectively rendering resistor 17 of the voltage divider 17, 18 – 19 effective. This sets the threshold value of the threshold stage 15. Other resistors in the voltage divider 17, 18, 19 which are likewise bridged by burn-off paths can be used to set any desired threshold value. The signal appearing at the output of the threshold stage 15 which is either a 0-signal or a 1-signal is initially also available at terminal 23. Upon removal of the burn-off path 22, the output signal of the threshold stage 15 is inverted in the inverter 21 and terminal 23 will have the opposite signal available thereat. Thus, any desired input voltage which changes from negative to zero to positive can be associated, selectively, with a 1-signal or a 0-signal at terminal 23.

If more than one input is connected to the integrated circuit, then each one of the inputs can have a circuit as illustrated in FIG. 1 applied thereto. It is also possible to connect various inputs to a single input, and different voltages at that input can be used to control different input stages which, in turn, cause respective functions to be effected in the integrated circuit itself.

A variation is shown in FIG. 1*a*, in which two inputs 30, 30' are shown for illustration, although more than two can be used. The inputs 30, 30' are connected through respective inverters 31, 31' to terminal 12 of FIG. 1. Each one of the inverters 31, 31' is bridged by a respective shunt path 32, 32' which can be selectively burned off. The circuit of FIG. l*a* can, of course, be combined with the straight-through circuit 10-11-12 as shown in FIG. 1. Thus, a 1-signal applied to terminal 10, for example, will cause a certain output from threshold stage 15. A negative 1-signal applied to terminal 30 will cause the same output from stage 15 if the shunt path 32 is burned away, while a positive 1-signal applied to terminal 30' will have the same effect as that applied to terminal 10 if the shunt path 32' is left alone.

FIG. 2 shows a program-controlled inverter stage 21 in which the positive terminal 16 of the supply source is connected through the series circuit of a resistor 24 and the collector-emitter path of a transistor 25 to ground or chassis. The junction between resistor 24 and transistor 25 is connected to the output terminal 23. Diode 26 connects the output from threshold stage 15 to the base of transistor 25.

OPERATION, CIRCUIT OF FIG. 2:

If the shunt path 22 is burned off, an output signal from threshold stage 15 causes transistor 25 to become conductive, thus placing the terminal 23 at zero voltage. Thus, the inverter 21 is effective. If the shunt path 22 is present, however, a 1-signal of the threshold stage 15 can control through terminal 23 and line 23' the bases of subsequently connected transistors T1, T2 . . . Tn, as well as the base of transistor 25. Diode 26 approximately halves the base-emitter voltage of the transistor 25 so that the collector-emitter current flowing therethrough will be practically negligible. This permits simultaneous control of a plurality of transistors T1, T2 . . . Tn of the integrated circuit connected to terminal 23 through lines 23', since the base current available to the transistors T1, T2 . . . Tn will be substantial and is not effectively reduced by the presence of the transistor 25.

Various changes and modifications may be made, and features described in connection with any one of the embodiments may be used with any of the others, within the scope of the inventive concept.

I claim:

1. Integrated circuit for use with variable voltage inputs comprising
  a signal processing stage;
  an input stage having its output connected to the signal processing stage and its input connected to a signal source (10),
  said input stage including
  a threshold circuit (15) connected to the signal source;
  a voltage divider (13, 14; 17, 18, 19) having a plurality of circuit components connected to the threshold circuit (15) and determining its threshold response level, and
  at least one burn-off shunt path (20) connected in parallel with at least one circuit component (17) of the voltage divider to permit modification of the response level of the threshold circuit (15) with respect to a predetermined signal level of the input signal source.

2. Circuit according to claim 1, further comprising an output inverter stage (21) serially connected to the output of the threshold circuit (15); and an additional burn-off shunt path (22) connected in parallel with the inverter stage (21).

3. Circuit according to claim 1, further comprising an input inverter stage (31, 31') serially connected in advance of the input (10, 12) of the inverter stage (15);
  and an input burn-off shunt path (32, 32') connected in parallel with the input inverter stage (31, 31').

4. Circuit according to claim 3, wherein a plurality of inputs (10, 30, 30') are provided, connected to said threshold circuit (15), at least some of the inputs (30, 30') being connected to the threshold circuit (15) through an additional inverter stage (31, 31') bridged by a burn-off shunt path (32, 32').

5. Circuit according to claim 1, further comprising an inverter stage (21) serially connected to the threshold circuit (15);
  said inverter stage (21) comprising a transistor (25) having its main switching path connected between the output of the inverter stage (21) and ground or chassis;
  and a semiconductor (26) connected to the input of the inverter stage (21) and to the base of the transistor (25).

6. Circuit according to claim 2, wherein the inverter stage (21) comprises a transistor (25) having its main switching path connected between the output of the inverter stage (21) and ground or chassis;
  and a semiconductor diode (26) connecting the input of the inverter stage (21) to the base of the transistor (25).

7. Circuit according to claim 1, wherein the threshold circuit comprises an operational amplifier (15) in integrated circuit form.

8. Circuit according to claim 1, wherein the threshold circuit comprises an operational amplifier (15) in integrated circuit form and integrated with said signal processing stage.

9. Circuit according to claim 8, further comprising at least one inverter stage (21; 31, 31') serially connected to the operational amplifier (15) and a burn-off shunt path (22; 32, 32') connected in parallel with at least one of said at least one inverter stages (21, 31, 31').

* * * * *